US008686313B2

(12) United States Patent
Watkins et al.

(10) Patent No.: US 8,686,313 B2
(45) Date of Patent: Apr. 1, 2014

(54) SYSTEM AND METHODS FOR FORMING APERTURES IN MICROFEATURE WORKPIECES

(71) Applicant: Micron Technology, Inc., Boise, ID (US)

(72) Inventors: Charles M. Watkins, Eagle, ID (US); William M. Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/029,105

(22) Filed: Sep. 17, 2013

(65) Prior Publication Data

US 2014/0014635 A1  Jan. 16, 2014

Related U.S. Application Data

(62) Division of application No. 11/413,289, filed on Apr. 28, 2006, now Pat. No. 8,534,485, which is a division of application No. 10/839,457, filed on May 5, 2004, now abandoned.

(51) Int. Cl.
*H01L 21/00* (2006.01)
*B23K 26/36* (2006.01)

(52) U.S. Cl.
USPC ............... 219/121.62; 219/121.71; 29/852; 216/94; 65/105; 438/106; 438/109

(58) Field of Classification Search
USPC ............ 219/121.62, 121.71, 121.72; 29/830, 29/852; 216/18, 20, 94; 65/105; 438/106, 438/109
See application file for complete search history.

(56) References Cited

U.S. PATENT DOCUMENTS

| | | | |
|---|---|---|---|
| 2,821,959 | A | 2/1958 | Franz |
| 3,006,318 | A | 10/1961 | Monroe, Jr. et al. |
| 3,345,134 | A | 10/1967 | Heymer et al. |
| 3,865,298 | A | 2/1975 | Allen et al. |
| 3,902,036 | A | 8/1975 | Zaleckas |
| 4,040,168 | A | 8/1977 | Huang |
| 4,368,106 | A | 1/1983 | Anthony |

(Continued)

FOREIGN PATENT DOCUMENTS

| | | |
|---|---|---|
| DE | 10205026 C1 | 5/2003 |
| EP | 0 013 657 A1 | 7/1980 |

(Continued)

OTHER PUBLICATIONS

Aachboun, S. and P. Ranson, "Cryogenic etching of deep narrow trenches in silicon," J. Vac. Sci. Technol. A 18 (4), Jul./Aug. 2000, pp. 1848-1852.

(Continued)

*Primary Examiner* — Samuel M Heinrich
(74) *Attorney, Agent, or Firm* — Perkins Coie LLP

(57) ABSTRACT

Systems and methods for forming apertures in microfeature workpieces are disclosed herein. In one embodiment, a method includes directing a laser beam toward a microfeature workpiece to form an aperture and sensing the laser beam pass through the microfeature workpiece in real time. The method can further include determining a number of pulses of the laser beam and/or an elapsed time to form the aperture and controlling the laser beam based on the determined number of pulses and/or the determined elapsed time to form a second aperture in the microfeature workpiece.

6 Claims, 4 Drawing Sheets

(56) References Cited

U.S. PATENT DOCUMENTS

| | | |
|---|---|---|
| 4,534,100 A | 8/1985 | Lane |
| 4,581,301 A | 4/1986 | Michaelson |
| 4,608,480 A | 8/1986 | Bizot et al. |
| 4,614,427 A | 9/1986 | Koizumi et al. |
| 4,627,971 A | 12/1986 | Ayer |
| 4,660,063 A | 4/1987 | Anthony |
| 4,756,765 A | 7/1988 | Woodroffe |
| 4,768,291 A | 9/1988 | Palmer |
| 4,959,705 A | 9/1990 | Lemnios et al. |
| 4,964,212 A | 10/1990 | Deroux-Dauphin et al. |
| 4,984,597 A | 1/1991 | McConnell et al. |
| 5,024,966 A | 6/1991 | Dietrich et al. |
| 5,026,964 A | 6/1991 | Somers et al. |
| 5,027,184 A | 6/1991 | Soclof |
| 5,037,782 A | 8/1991 | Nakamura et al. |
| 5,123,902 A | 6/1992 | Muller et al. |
| 5,145,099 A | 9/1992 | Wood et al. |
| 5,158,911 A | 10/1992 | Quentin et al. |
| 5,219,344 A | 6/1993 | Yoder, Jr. |
| 5,233,448 A | 8/1993 | Wu et al. |
| 5,237,148 A | 8/1993 | Aoki et al. |
| 5,254,237 A | 10/1993 | Snaper et al. |
| 5,289,631 A | 3/1994 | Koopman et al. |
| 5,292,686 A | 3/1994 | Riley et al. |
| 5,294,568 A | 3/1994 | McNeilly et al. |
| 5,298,975 A | 3/1994 | Khoury et al. |
| 5,378,312 A | 1/1995 | Gifford et al. |
| 5,378,313 A | 1/1995 | Pace |
| 5,380,681 A | 1/1995 | Hsu et al. |
| 5,402,435 A | 3/1995 | Shiono et al. |
| 5,406,630 A | 4/1995 | Piosenka et al. |
| 5,424,573 A | 6/1995 | Kato et al. |
| 5,438,212 A | 8/1995 | Okaniwa et al. |
| 5,447,871 A | 9/1995 | Goldstein |
| 5,464,960 A | 11/1995 | Hall et al. |
| 5,481,483 A | 1/1996 | Ebenstein |
| 5,496,755 A | 3/1996 | Bayraktaroglu |
| 5,515,167 A | 5/1996 | Ledger et al. |
| 5,518,956 A | 5/1996 | Liu et al. |
| 5,585,308 A | 12/1996 | Sardella |
| 5,585,675 A | 12/1996 | Knopf |
| 5,614,743 A | 3/1997 | Mochizuki et al. |
| 5,618,752 A | 4/1997 | Gaul |
| 5,624,437 A | 4/1997 | Freeman et al. |
| 5,627,106 A | 5/1997 | Hsu et al. |
| 5,646,067 A | 7/1997 | Gaul |
| 5,654,221 A | 8/1997 | Cronin et al. |
| 5,673,846 A | 10/1997 | Gruber |
| 5,681,490 A | 10/1997 | Chang |
| 5,684,642 A | 11/1997 | Zumoto et al. |
| 5,690,841 A | 11/1997 | Elderstig et al. |
| 5,718,791 A | 2/1998 | Spengler et al. |
| 5,723,904 A | 3/1998 | Shiga |
| 5,726,493 A | 3/1998 | Yamashita et al. |
| 5,733,278 A | 3/1998 | Slatkine et al. |
| 5,771,158 A | 6/1998 | Yamagishi et al. |
| 5,773,359 A | 6/1998 | Mitchell et al. |
| 5,776,824 A | 7/1998 | Farnworth et al. |
| 5,807,439 A | 9/1998 | Akatsu et al. |
| 5,811,799 A | 9/1998 | Wu |
| 5,821,532 A | 10/1998 | Beaman et al. |
| 5,825,080 A | 10/1998 | Imaoka et al. |
| 5,826,628 A | 10/1998 | Hamilton |
| 5,847,454 A | 12/1998 | Shaw et al. |
| 5,851,845 A | 12/1998 | Wood et al. |
| 5,857,963 A | 1/1999 | Pelchy et al. |
| 5,861,654 A | 1/1999 | Johnson |
| 5,870,289 A | 2/1999 | Tokuda et al. |
| 5,870,823 A | 2/1999 | Bezama et al. |
| 5,893,828 A | 4/1999 | Uram |
| 5,904,499 A | 5/1999 | Pace |
| 5,933,713 A | 8/1999 | Farnworth |
| 5,946,553 A | 8/1999 | Wood et al. |
| 5,969,422 A | 10/1999 | Ting et al. |
| 5,998,240 A | 12/1999 | Hamilton et al. |
| 5,998,292 A | 12/1999 | Black et al. |
| 6,004,867 A | 12/1999 | Kim et al. |
| 6,008,070 A | 12/1999 | Farnworth |
| 6,008,914 A | 12/1999 | Sasagawa et al. |
| 6,020,624 A | 2/2000 | Wood et al. |
| 6,072,236 A | 6/2000 | Akram et al. |
| 6,080,291 A | 6/2000 | Woodruff et al. |
| 6,097,087 A | 8/2000 | Farnworth et al. |
| 6,103,547 A | 8/2000 | Corisis et al. |
| 6,107,180 A | 8/2000 | Munroe et al. |
| 6,107,679 A | 8/2000 | Noguchi |
| 6,110,825 A | 8/2000 | Mastromatteo et al. |
| 6,114,240 A | 9/2000 | Akram et al. |
| 6,119,335 A | 9/2000 | Park et al. |
| 6,124,634 A | 9/2000 | Akram et al. |
| 6,130,141 A | 10/2000 | Degani et al. |
| 6,133,622 A | 10/2000 | Corisis et al. |
| 6,137,182 A | 10/2000 | Hause et al. |
| 6,140,604 A | 10/2000 | Somers et al. |
| 6,143,588 A | 11/2000 | Glenn |
| 6,148,509 A | 11/2000 | Schoenfeld et al. |
| 6,159,764 A | 12/2000 | Kinsman et al. |
| 6,180,518 B1 | 1/2001 | Layadi et al. |
| 6,184,060 B1 | 2/2001 | Siniaguine |
| 6,184,465 B1 | 2/2001 | Corisis |
| 6,187,615 B1 | 2/2001 | Kim et al. |
| 6,191,487 B1 | 2/2001 | Rodenbeck et al. |
| 6,203,539 B1 | 3/2001 | Shimmick et al. |
| 6,222,136 B1 | 4/2001 | Appelt et al. |
| 6,222,270 B1 | 4/2001 | Lee et al. |
| 6,228,687 B1 | 5/2001 | Akram et al. |
| 6,229,113 B1 | 5/2001 | Brown |
| 6,229,202 B1 | 5/2001 | Corisis |
| 6,235,552 B1 | 5/2001 | Kwon et al. |
| 6,246,108 B1 | 6/2001 | Corisis et al. |
| 6,252,300 B1 | 6/2001 | Hsuan et al. |
| 6,268,114 B1 | 7/2001 | Wen et al. |
| 6,271,580 B1 | 8/2001 | Corisis |
| 6,277,757 B1 | 8/2001 | Lin et al. |
| 6,291,894 B1 | 9/2001 | Farnworth et al. |
| 6,294,837 B1 | 9/2001 | Akram et al. |
| 6,297,155 B1 | 10/2001 | Simpson et al. |
| 6,306,680 B1 * | 10/2001 | Fillion et al. ................. 438/106 |
| 6,324,253 B1 | 11/2001 | Yuyama et al. |
| 6,326,689 B1 | 12/2001 | Thomas |
| 6,326,697 B1 | 12/2001 | Farnworth |
| 6,326,698 B1 | 12/2001 | Akram |
| 6,329,632 B1 | 12/2001 | Fournier et al. |
| 6,341,009 B1 | 1/2002 | O'Connor et al. |
| 6,344,976 B1 | 2/2002 | Schoenfeld et al. |
| 6,359,254 B1 | 3/2002 | Brown |
| 6,359,328 B1 | 3/2002 | Dubin |
| 6,372,548 B2 | 4/2002 | Bessho et al. |
| 6,388,208 B1 | 5/2002 | Kiani et al. |
| 6,391,770 B2 | 5/2002 | Kosaki et al. |
| 6,406,636 B1 | 6/2002 | Vaganov |
| 6,407,381 B1 | 6/2002 | Glenn et al. |
| 6,432,821 B1 | 8/2002 | Dubin et al. |
| 6,433,303 B1 | 8/2002 | Liu et al. |
| 6,433,304 B2 | 8/2002 | Okumura et al. |
| 6,437,284 B1 | 8/2002 | Okamoto et al. |
| 6,437,441 B1 | 8/2002 | Yamamoto et al. |
| 6,439,054 B1 | 8/2002 | Gore et al. |
| 6,441,487 B2 | 8/2002 | Elenius et al. |
| 6,452,270 B1 | 9/2002 | Huang et al. |
| 6,457,515 B1 | 10/2002 | Vafai et al. |
| 6,459,039 B1 | 10/2002 | Bezama et al. |
| 6,459,150 B1 | 10/2002 | Wu et al. |
| 6,468,889 B1 | 10/2002 | Iacoponi et al. |
| 6,486,083 B1 | 11/2002 | Mizuno et al. |
| 6,486,549 B1 | 11/2002 | Chiang et al. |
| 6,503,780 B1 | 1/2003 | Glenn et al. |
| 6,521,516 B2 | 2/2003 | Monzon et al. |
| 6,521,530 B2 | 2/2003 | Peters et al. |
| 6,534,192 B1 | 3/2003 | Abys et al. |
| 6,534,863 B2 | 3/2003 | Walker et al. |
| 6,545,563 B1 | 4/2003 | Smith |
| 6,560,047 B2 | 5/2003 | Kim et al. |
| 6,569,711 B1 | 5/2003 | Susko et al. |

(56) References Cited

U.S. PATENT DOCUMENTS

| | | |
|---|---|---|
| 6,569,777 B1 | 5/2003 | Hsu et al. |
| 6,572,606 B2 | 6/2003 | Kliewer et al. |
| 6,576,531 B2 | 6/2003 | Peng et al. |
| 6,580,174 B2 | 6/2003 | McCormick et al. |
| 6,582,987 B2 | 6/2003 | Jun et al. |
| 6,582,992 B2 | 6/2003 | Poo et al. |
| 6,593,644 B2 | 7/2003 | Chiu et al. |
| 6,599,436 B1 | 7/2003 | Matzke et al. |
| 6,606,251 B1 | 8/2003 | Kenny, Jr. et al. |
| 6,614,033 B2 | 9/2003 | Suguro et al. |
| 6,620,031 B2 | 9/2003 | Renteln |
| 6,620,731 B1 | 9/2003 | Farnworth et al. |
| 6,621,045 B1 | 9/2003 | Liu et al. |
| 6,638,410 B2 | 10/2003 | Chen et al. |
| 6,653,236 B2 | 11/2003 | Wai et al. |
| 6,658,818 B2 | 12/2003 | Kurth et al. |
| 6,660,622 B2 | 12/2003 | Chen et al. |
| 6,660,630 B1 | 12/2003 | Chang et al. |
| 6,664,129 B2 | 12/2003 | Siniaguine |
| 6,664,485 B2 | 12/2003 | Bhatt et al. |
| 6,667,551 B2 | 12/2003 | Hanaoka et al. |
| 6,680,459 B2 | 1/2004 | Kanaya et al. |
| 6,699,787 B2 | 3/2004 | Mashino et al. |
| 6,703,310 B2 | 3/2004 | Mashino et al. |
| 6,708,405 B2 | 3/2004 | Hasler et al. |
| 6,746,971 B1 | 6/2004 | Ngo et al. |
| 6,747,244 B1 | 6/2004 | Koide |
| 6,750,144 B2 | 6/2004 | Taylor |
| 6,756,564 B2 | 6/2004 | Tian |
| 6,770,958 B2 | 8/2004 | Wang et al. |
| 6,774,486 B2 | 8/2004 | Kinsman |
| 6,777,244 B2 | 8/2004 | Pepper et al. |
| 6,780,749 B2 | 8/2004 | Masumoto et al. |
| 6,790,775 B2 | 9/2004 | Fartash |
| 6,797,616 B2 | 9/2004 | Kinsman |
| 6,809,025 B2 | 10/2004 | Sandhu et al. |
| 6,809,421 B1 | 10/2004 | Hayasaka et al. |
| 6,818,464 B2 | 11/2004 | Heschel |
| 6,825,127 B2 | 11/2004 | Ouellet et al. |
| 6,825,557 B2 | 11/2004 | DiBattista et al. |
| 6,828,175 B2 | 12/2004 | Wood et al. |
| 6,828,223 B2 | 12/2004 | Chuang |
| 6,838,377 B2 | 1/2005 | Tonami et al. |
| 6,841,849 B2 | 1/2005 | Miyazawa |
| 6,852,621 B2 | 2/2005 | Hanaoka et al. |
| 6,856,023 B2 | 2/2005 | Muta et al. |
| 6,858,891 B2 | 2/2005 | Farnworth et al. |
| 6,864,172 B2 | 3/2005 | Noma et al. |
| 6,864,457 B1 | 3/2005 | Alexander et al. |
| 6,867,390 B2 | 3/2005 | Clauer et al. |
| 6,873,054 B2 | 3/2005 | Miyazawa et al. |
| 6,882,030 B2 | 4/2005 | Siniaguine |
| 6,885,107 B2 | 4/2005 | Kinsman |
| 6,903,012 B2 | 6/2005 | Geefay et al. |
| 6,903,442 B2 | 6/2005 | Wood et al. |
| 6,903,443 B2 | 6/2005 | Farnworth et al. |
| 6,910,268 B2 | 6/2005 | Miller |
| 6,913,952 B2 | 7/2005 | Moxham et al. |
| 6,916,725 B2 | 7/2005 | Yamaguchi |
| 6,936,536 B2 | 8/2005 | Sinha |
| 6,939,343 B2 | 9/2005 | Sumiya |
| 6,943,056 B2 | 9/2005 | Nemoto et al. |
| 6,946,325 B2 | 9/2005 | Yean et al. |
| 6,951,627 B2 | 10/2005 | Li et al. |
| 6,953,748 B2 | 10/2005 | Yamaguchi et al. |
| 6,962,867 B2 | 11/2005 | Jackson et al. |
| 6,970,775 B2 | 11/2005 | Lederle et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa et al. |
| 7,033,927 B2 | 4/2006 | Cohen et al. |
| 7,037,836 B2 | 5/2006 | Lee |
| 7,041,598 B2 | 5/2006 | Sharma |
| 7,045,015 B2 | 5/2006 | Renn et al. |
| 7,083,425 B2 | 8/2006 | Chong et al. |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,098,140 B2 | 8/2006 | Schaller et al. |
| 7,109,068 B2 | 9/2006 | Akram et al. |
| 7,129,112 B2 | 10/2006 | Matsuo |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Meyers et al. |
| 7,186,650 B1 | 3/2007 | Dakshina-Murthy |
| 7,190,061 B2 | 3/2007 | Lee et al. |
| 7,199,050 B2 | 4/2007 | Hiatt |
| 7,214,615 B2 | 5/2007 | Miyazawa |
| 7,217,596 B2 | 5/2007 | Cobbley et al. |
| 7,217,888 B2 | 5/2007 | Sunohara et al. |
| 7,223,634 B2 | 5/2007 | Yamaguchi |
| 7,232,754 B2 | 6/2007 | Kirby et al. |
| 7,256,073 B2 | 8/2007 | Noma et al. |
| 7,262,134 B2 | 8/2007 | Kirby et al. |
| 7,262,495 B2 | 8/2007 | Chen et al. |
| 7,265,052 B2 | 9/2007 | Sinha |
| 7,271,482 B2 | 9/2007 | Kirby |
| 7,300,857 B2 | 11/2007 | Akram et al. |
| 7,317,256 B2 | 1/2008 | Williams et al. |
| 7,491,582 B2 | 2/2009 | Yokoyama et al. |
| 7,498,661 B2 | 3/2009 | Matsuo |
| 2001/0020739 A1 | 9/2001 | Honda |
| 2001/0040151 A1 | 11/2001 | Isaji et al. |
| 2002/0005583 A1 | 1/2002 | Harada et al. |
| 2002/0020898 A1 | 2/2002 | Vu et al. |
| 2002/0027293 A1 | 3/2002 | Hoshino |
| 2002/0057468 A1 | 5/2002 | Segawa et al. |
| 2002/0059722 A1 | 5/2002 | Murakami |
| 2002/0060208 A1 | 5/2002 | Liu et al. |
| 2002/0094607 A1 | 7/2002 | Gebauer et al. |
| 2002/0096729 A1 | 7/2002 | Tu et al. |
| 2002/0126716 A1 | 9/2002 | Vreeland |
| 2002/0130390 A1 | 9/2002 | Ker et al. |
| 2002/0190371 A1 | 12/2002 | Mashino et al. |
| 2003/0000927 A1 | 1/2003 | Kanaya et al. |
| 2003/0014895 A1 | 1/2003 | Lizotte |
| 2003/0042564 A1 | 3/2003 | Taniguchi et al. |
| 2003/0119308 A1 | 6/2003 | Geefay et al. |
| 2003/0148597 A1 | 8/2003 | Tan et al. |
| 2003/0216023 A1 | 11/2003 | Wark et al. |
| 2004/0004280 A1 | 1/2004 | Shibata |
| 2004/0018712 A1 | 1/2004 | Plas et al. |
| 2004/0023447 A1 | 2/2004 | Hirakata et al. |
| 2004/0041261 A1 | 3/2004 | Kinsman |
| 2004/0043607 A1 | 3/2004 | Farnworth et al. |
| 2004/0046251 A1 | 3/2004 | Lee |
| 2004/0073607 A1 | 4/2004 | Su et al. |
| 2004/0087441 A1 | 5/2004 | Bock et al. |
| 2004/0094389 A1 | 5/2004 | Boyce |
| 2004/0137661 A1 | 7/2004 | Murayama |
| 2004/0137701 A1 | 7/2004 | Takao |
| 2004/0141536 A1 | 7/2004 | Liu et al. |
| 2004/0159668 A1 | 8/2004 | Vasiadis |
| 2004/0159958 A1 | 8/2004 | Funaki |
| 2004/0178491 A1 | 9/2004 | Akram et al. |
| 2004/0180539 A1 | 9/2004 | Yamamoto et al. |
| 2004/0188260 A1 | 9/2004 | Bonkabeta et al. |
| 2004/0192033 A1 | 9/2004 | Hara |
| 2004/0195576 A1 | 10/2004 | Watanabe et al. |
| 2004/0198033 A1 | 10/2004 | Lee et al. |
| 2004/0198040 A1 | 10/2004 | Geefay et al. |
| 2004/0200341 A1 | 10/2004 | Walters et al. |
| 2004/0203177 A1 | 10/2004 | Davis et al. |
| 2004/0219342 A1 | 11/2004 | Boggs et al. |
| 2004/0219763 A1 | 11/2004 | Kim et al. |
| 2004/0222082 A1 | 11/2004 | Gopalraja et al. |
| 2004/0245649 A1 | 12/2004 | Imaoka |
| 2004/0255258 A1 | 12/2004 | Li |
| 2004/0262753 A1 | 12/2004 | Kashiwazaki |

(56) References Cited

U.S. PATENT DOCUMENTS

| | | |
|---|---|---|
| 2005/0026443 A1 | 2/2005 | Goo et al. |
| 2005/0037608 A1 | 2/2005 | Andricacos et al. |
| 2005/0046002 A1 | 3/2005 | Lee et al. |
| 2005/0064707 A1 | 3/2005 | Sinha |
| 2005/0067620 A1 | 3/2005 | Chan et al. |
| 2005/0069782 A1 | 3/2005 | Elenius et al. |
| 2005/0101054 A1 | 5/2005 | Mastromatteo et al. |
| 2005/0101116 A1 | 5/2005 | Tseng |
| 2005/0104228 A1 | 5/2005 | Rigg et al. |
| 2005/0106834 A1 | 5/2005 | Andry et al. |
| 2005/0110095 A1 | 5/2005 | Shih et al. |
| 2005/0110889 A1 | 5/2005 | Tuttle et al. |
| 2005/0127478 A1 | 6/2005 | Hiatt et al. |
| 2005/0136646 A1 | 6/2005 | Larnerd et al. |
| 2005/0139390 A1 | 6/2005 | Kim et al. |
| 2005/0150683 A1 | 7/2005 | Farnworth et al. |
| 2005/0151228 A1 | 7/2005 | Tanida et al. |
| 2005/0164500 A1 | 7/2005 | Lindgren |
| 2005/0184219 A1 | 8/2005 | Kirby |
| 2005/0191861 A1 | 9/2005 | Verhaverbeke |
| 2005/0194169 A1 | 9/2005 | Tonomura |
| 2005/0208766 A1 | 9/2005 | Kirby et al. |
| 2005/0227382 A1 | 10/2005 | Hui |
| 2005/0231626 A1 | 10/2005 | Tuttle et al. |
| 2005/0236708 A1 | 10/2005 | Farnworth et al. |
| 2005/0247894 A1 | 11/2005 | Watkins et al. |
| 2005/0253213 A1 | 11/2005 | Jiang et al. |
| 2005/0254133 A1 | 11/2005 | Akram et al. |
| 2005/0258530 A1 | 11/2005 | Vindasius et al. |
| 2005/0272221 A1 | 12/2005 | Yen et al. |
| 2005/0275048 A1 | 12/2005 | Farnworth et al. |
| 2005/0275049 A1 | 12/2005 | Kirby et al. |
| 2005/0275051 A1 | 12/2005 | Farnworth et al. |
| 2005/0275750 A1 | 12/2005 | Akram et al. |
| 2005/0277293 A1 | 12/2005 | Kim et al. |
| 2005/0282374 A1 | 12/2005 | Hwang et al. |
| 2005/0285154 A1 | 12/2005 | Akram et al. |
| 2006/0003566 A1 | 1/2006 | Emesh |
| 2006/0011809 A1 | 1/2006 | Farnworth et al. |
| 2006/0014313 A1 | 1/2006 | Hall et al. |
| 2006/0023107 A1 | 2/2006 | Bolken et al. |
| 2006/0024856 A1 | 2/2006 | Derderian et al. |
| 2006/0035402 A1 | 2/2006 | Street et al. |
| 2006/0035415 A1 | 2/2006 | Wood et al. |
| 2006/0038183 A1 | 2/2006 | Oliver |
| 2006/0038272 A1 | 2/2006 | Edwards |
| 2006/0040421 A1 | 2/2006 | Farnworth et al. |
| 2006/0040428 A1 | 2/2006 | Johnson |
| 2006/0042952 A1 | 3/2006 | Oliver et al. |
| 2006/0043262 A1 | 3/2006 | Akram |
| 2006/0043509 A1 | 3/2006 | Watkins et al. |
| 2006/0043512 A1 | 3/2006 | Oliver et al. |
| 2006/0043569 A1 | 3/2006 | Benson et al. |
| 2006/0044433 A1 | 3/2006 | Akram |
| 2006/0046332 A1 | 3/2006 | Derderian et al. |
| 2006/0046438 A1 | 3/2006 | Kirby |
| 2006/0046468 A1 | 3/2006 | Akram et al. |
| 2006/0046471 A1 | 3/2006 | Kirby et al. |
| 2006/0057776 A1 | 3/2006 | Tao |
| 2006/0057836 A1 | 3/2006 | Nagarajan et al. |
| 2006/0071347 A1 | 4/2006 | Dotta |
| 2006/0148250 A1 | 7/2006 | Kirby |
| 2006/0151880 A1 | 7/2006 | Tang et al. |
| 2006/0154153 A1 | 7/2006 | Chiang et al. |
| 2006/0160367 A1 | 7/2006 | Wai et al. |
| 2006/0177959 A1 | 8/2006 | Boettiger et al. |
| 2006/0177999 A1 | 8/2006 | Hembree et al. |
| 2006/0180941 A1 | 8/2006 | Kirby et al. |
| 2006/0186097 A1 | 8/2006 | Watkins et al. |
| 2006/0186492 A1 | 8/2006 | Boettiger et al. |
| 2006/0191882 A1 | 8/2006 | Watkins et al. |
| 2006/0199363 A1 | 9/2006 | Kirby et al. |
| 2006/0204651 A1 | 9/2006 | Wai et al. |
| 2006/0208360 A1 | 9/2006 | Yiu et al. |
| 2006/0216862 A1 | 9/2006 | Rigg et al. |
| 2006/0223301 A1 | 10/2006 | Vanhaelemeersch et al. |
| 2006/0249849 A1 | 11/2006 | Cohen |
| 2006/0252254 A1 | 11/2006 | Basol |
| 2006/0252262 A1 | 11/2006 | Kazemi |
| 2006/0255443 A1 | 11/2006 | Hwang et al. |
| 2006/0264041 A1 | 11/2006 | Rigg et al. |
| 2006/0270108 A1 | 11/2006 | Farnworth et al. |
| 2006/0278979 A1 | 12/2006 | Rangel |
| 2006/0278980 A1 | 12/2006 | Trezza et al. |
| 2006/0278988 A1 | 12/2006 | Trezza et al. |
| 2006/0278989 A1 | 12/2006 | Trezza |
| 2006/0281224 A1 | 12/2006 | Edelstein et al. |
| 2006/0281243 A1 | 12/2006 | Trezza |
| 2006/0289967 A1 | 12/2006 | Heck et al. |
| 2006/0289968 A1 | 12/2006 | Sulfridge |
| 2006/0290001 A1 | 12/2006 | Sulfridge |
| 2006/0292877 A1 | 12/2006 | Lake |
| 2007/0004079 A1 | 1/2007 | Geefay et al. |
| 2007/0012655 A1 | 1/2007 | Kwon et al. |
| 2007/0020805 A1 | 1/2007 | Kim et al. |
| 2007/0020935 A1 | 1/2007 | Taylor et al. |
| 2007/0023121 A1 | 2/2007 | Jones et al. |
| 2007/0032061 A1 | 2/2007 | Farnworth et al. |
| 2007/0035033 A1 | 2/2007 | Ozguz et al. |
| 2007/0037379 A1 | 2/2007 | Enquist et al. |
| 2007/0042598 A1 | 2/2007 | Park |
| 2007/0045120 A1 | 3/2007 | Tiwari et al. |
| 2007/0045388 A1 | 3/2007 | Farnworth et al. |
| 2007/0045515 A1 | 3/2007 | Farnworth et al. |
| 2007/0045632 A1 | 3/2007 | Oliver et al. |
| 2007/0045779 A1 | 3/2007 | Hiatt |
| 2007/0045806 A1 | 3/2007 | Hsuan |
| 2007/0045812 A1 | 3/2007 | Heng |
| 2007/0045826 A1 | 3/2007 | Lee et al. |
| 2007/0045834 A1 | 3/2007 | Chong et al. |
| 2007/0048896 A1 | 3/2007 | Andry et al. |
| 2007/0048994 A1 | 3/2007 | Tuttle |
| 2007/0049016 A1 | 3/2007 | Hiatt et al. |
| 2007/0049019 A1 | 3/2007 | Wai et al. |
| 2007/0057028 A1 | 3/2007 | Lake et al. |
| 2007/0077753 A1 | 4/2007 | Iwatake et al. |
| 2007/0082427 A1 | 4/2007 | Shirahama et al. |
| 2007/0096263 A1 | 5/2007 | Furukawa et al. |
| 2007/0099395 A1 | 5/2007 | Sridhar et al. |
| 2007/0105247 A1 | 5/2007 | Mauersberger et al. |
| 2007/0111386 A1 | 5/2007 | Kim et al. |
| 2007/0122940 A1 | 5/2007 | Gautham |
| 2007/0138562 A1 | 6/2007 | Trezza |
| 2007/0145563 A1 | 6/2007 | Punzalan et al. |
| 2007/0152342 A1 | 7/2007 | Tsao et al. |
| 2007/0155997 A1 | 7/2007 | Li et al. |
| 2007/0158839 A1 | 7/2007 | Trezza |
| 2007/0158853 A1 | 7/2007 | Sinha |
| 2007/0161235 A1 | 7/2007 | Trezza |
| 2007/0166991 A1 | 7/2007 | Sinha |
| 2007/0166997 A1 | 7/2007 | Knorr |
| 2007/0167004 A1 | 7/2007 | Trezza |
| 2007/0170574 A1 | 7/2007 | Lauxtermann et al. |
| 2007/0178694 A1 | 8/2007 | Hiatt |
| 2007/0182020 A1 | 8/2007 | Trezza et al. |
| 2007/0190803 A1 | 8/2007 | Singh et al. |
| 2007/0197013 A1 | 8/2007 | Trezza |
| 2007/0202617 A1 | 8/2007 | Hembree |
| 2007/0222050 A1 | 9/2007 | Lee et al. |
| 2007/0222054 A1 | 9/2007 | Hembree |
| 2007/0228576 A1 | 10/2007 | Trezza |
| 2007/0228926 A1 | 10/2007 | Teo et al. |
| 2007/0262424 A1 | 11/2007 | Hiatt |
| 2007/0267138 A1 | 11/2007 | White et al. |
| 2007/0281473 A1 | 12/2007 | Clark et al. |
| 2007/0293040 A1 | 12/2007 | Emesh et al. |
| 2008/0006850 A1 | 1/2008 | Ribnicek et al. |
| 2008/0050904 A1 | 2/2008 | Lake |
| 2008/0050911 A1 | 2/2008 | Borthakur |
| 2008/0054444 A1 | 3/2008 | Tuttle |
| 2008/0057620 A1 | 3/2008 | Pratt |
| 2008/0079120 A1 | 4/2008 | Foster et al. |
| 2008/0079121 A1 | 4/2008 | Han |
| 2008/0081386 A1 | 4/2008 | Raravikar et al. |

(56) References Cited

U.S. PATENT DOCUMENTS

| | | | |
|---|---|---|---|
| 2008/0081398 | A1 | 4/2008 | Lee et al. |
| 2008/0265933 | A1 | 10/2008 | Tanioka et al. |
| 2009/0007934 | A1 | 1/2009 | Hutto |
| 2009/0014859 | A1 | 1/2009 | Jeung et al. |
| 2009/0057912 | A1 | 3/2009 | Kheng |

FOREIGN PATENT DOCUMENTS

| | | | |
|---|---|---|---|
| EP | 0127946 | A1 | 12/1984 |
| EP | 1154474 | A1 | 11/2001 |
| EP | 1415950 | A2 | 5/2004 |
| JP | 63052432 | A | 3/1988 |
| JP | 01252308 | A | 10/1989 |
| JP | 02235589 | A | 9/1990 |
| JP | 05104316 | A | 4/1993 |
| JP | 2000052078 | A | 2/2000 |
| JP | 2001077496 | A | 3/2001 |
| JP | 2001082931 | A | 3/2001 |
| JP | 2001298147 | A | 10/2001 |
| JP | 2002018585 | A | 1/2002 |
| JP | 2005093980 | A | 4/2005 |
| JP | 2005310817 | A | 11/2005 |
| KR | 20010018694 | | 3/2001 |
| KR | 20020022122 | A | 3/2002 |
| KR | 20020061812 | A | 7/2002 |
| TW | 250597 | B | 3/2006 |
| WO | 2004109770 | A2 | 12/2004 |
| WO | 2005022965 | A2 | 3/2005 |
| WO | 2005036940 | A1 | 4/2005 |
| WO | 2006053036 | A2 | 5/2006 |
| WO | 2006124597 | A2 | 11/2006 |
| WO | 2007025812 | A1 | 3/2007 |
| WO | 2007043718 | A1 | 4/2007 |

OTHER PUBLICATIONS

Aachboun, S. and P. Ranson, "Deep anisotropic etching of silicon," J. Vac. Sci. Technol. A 17(4), Jul./Aug. 1999, pp. 2270-2273.

Amazawa, T. et al., "Planarized Multilevel Interconnection Using Chemical Mechanical Polishing of Selective CVD-Al Via Plugs," IEEE Transactions on Electron Devices, vol. 45, No. 4, pp. 815-820, Apr. 1998.

Armacost, M. et al., "Plasma-Etching Processes for ULSI Semiconductor Circuits," IBM J. Res. Develop., vol. 43, No. 1/2, pp. 39-72, Jan./Mar. 1999, <http://www.research.ibm.com/journal/rd/431/armacost.pdf>.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp. 1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Blackburn, J.M. et al., "Deposition of Conformal Copper and Nickel Films from Supercritical Carbon Dioxide," Science, vol. 94, Oct. 2001, pp. 141-145.

Cheung, T.S.D. et al., "On-Chip Interconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, Jan. 25, 2000, <http://www.smta.org/files/PanPac00-ChouBill.pdf>.

De Boer, M.J. et al., "Micromachining of Buried Micro Channels in Silicon," Journal of Microelectromechanical Systems, vol. 9, No. 1, Mar. 2000, IEEE, ISSN: 1057-7157.

Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48.

Hirafune, S. et al., "Packaging Technology for Imager Using Through-hole Interconnection in Si Substrate," Proceeding of HDP'04, IEEE, pp. 303-306, Jul. 2004.

Jang, D.M. et al., "Development and Evaluation of 3-D SiP with Vertically Interconnected Through Silicon Vias (TSV)," Proceedings of the 57th Electronic Components and Technology Conference, IEEE, May 29 2007-Jun. 1 2007, pp. 847-852, ISBN: 1-4244-0985-3.

Kada, M. et al., "Advancements in Stacked Chip Scale Packaging (S-CSP) Provides System-in-a-Package Functionality for Wireless and Handheld Applications," Future Fab Intl., vol. 9, Jan. 7, 2000.

Keigler, A. et al., "Enabling 3-D Design," Semiconductor International, Aug. 2007.

Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.

Kuhn, Markus and Jose A. Rodriguez, "Adsorption of sulfur on bimetallic surfaces: Formation of copper sulfides on Pt (111) and Ru(001)," J. Vac. Sci. Technol. A 13(3), pp. 1569-1573, May/Jun. 1995.

Kurita, Y. et al., "A 3D Stacked Memory Integrated on a Logic Device Using SMAFTI Technology," 2007 IEEE Electronic Components and Technology Conference, pp. 821-829, May 29-Jun. 1, 2007, ISBN 1-4244-0985-3.

Kyocera Corporation, Memory Package, 1 page, retrieved from the Internet on Dec. 3, 2004, <http://global.kyocera.com/prdct/semicon/ic_pkg/memory_p.html>.

Lee, H.M. et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>.

Lee, R.A. et al., "Laser Created Silicon Vias for Stacking Dies in MCMs," IEEE/CHMT IEMT Symposium, 1991, pp. 262-265.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Moffat, T.P., et al. "Superconformal film growth; Mechanism and quantification," IBM J. Res. & Dev., vol. 49, No. 1, pp. 19-36, Jan. 2005.

Morrow, P.R. et al., "Three-Dimensional Wafer Stacking Via Cu-Cu Bonding Integrated With 65-nm Strained-Si/Low-k CMOS Technology," IEEE Electron Device Letters, vol. 27, No. 5, pp. 335-337, May 2006, ISBN: 0741-3106.

Pienimaa, S.K. et al., "Stacked Thin Dice Package," Proceedings of the 51st Electronic Components and Technology Conference, 2001, pp. 361-366, IEEE.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Schaper, L. et al., "Integrated System Development for 3-D VLSI," Electronic Components and Technology Conference, 2007, ECTC '07, Proceedings, 57th, May 29, 2007-Jun. 1, 2007, pp. 853-857.

Solberg, V., "Innovative 3-D Solutions for Multiple Die Packaging," SMTA International Conference, Sep. 21, 2003.

Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract.

Takahashi, K. et al "Through Silicon Via and 3-D Wafer/Chip Stacking Technology," 2006 Symposium on VLSI Circuits, Digest of Technical Papers, pp. 89-92, IEEE, ISBN: 1-4244-006-6.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29, 2007-Jun. 1, 2007, pp. 643-647.

Thomas, D.J. et al., "Etching of Vias and Trenches Through Low k Dielectrics with Feature Sizes Down to 0.1 mm Using M0RI™ High

(56) References Cited

OTHER PUBLICATIONS

Density Plasmas," presented at the 197th Meeting of the Electrochemical Society, Toronto 2000, <http://www.trikon.com/pdfs/ECS2b.pdf>.

Trigas, C., "System-In-Package or System-On-Chip?," EE Times, Sep. 19, 2003, <http://www.eetimes.com/story/OEG20030919S0049>.

Van Zant, Peter, Microchip Fabrication, 2000, McGraw-Hill, pp. 400 and 401.

Vereecken, P.M. et al., "The chemistry of additives in damascene copper plating," IBM J. Res. & Dev., vol. 49, No. 1, pp. 3-18, Jan. 2005.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

XSiL, xise200 for vias and micro-machining, <http://www.xsil.com/products/index/html>, retrieved from the Internet on Aug. 16, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

\* cited by examiner

SYSTEM AND METHODS FOR FORMING APERTURES IN MICROFEATURE WORKPIECES

CROSS-REFERENCE TO RELATED APPLICATIONS

This application is a divisional of U.S. application Ser. No. 11/413,289 filed Apr. 28, 2006, now U.S. Pat. No. 8,534,485, which is a divisional of U.S. application Ser. No. 10/839,457 filed May 5, 2004, now abandoned, and is related to U.S. application Ser. No. 11/414,999 filed May 1, 2006, each of which is incorporated herein by reference in its entirety.

TECHNICAL FIELD

The present invention is related to systems and methods for forming apertures in microfeature workpieces. More particularly, the invention is directed to systems and methods for forming apertures with laser beams.

BACKGROUND

Microelectronic devices are used in cell phones, pagers, personal digital assistants, computers, and many other products. A die-level packaged microelectronic device can include a microelectronic die, an interposer substrate or lead frame attached to the die, and a molded casing around the die. The microelectronic die generally has an integrated circuit and a plurality of bond-pads coupled to the integrated circuit. The bond-pads are coupled to terminals on the interposer substrate or lead frame. The interposer substrate can also include ball-pads coupled to the terminals by conductive traces in a dielectric material. An array of solder balls is configured so that each solder ball contacts a corresponding ball-pad to define a "ball-grid" array. Packaged microelectronic devices with ball-grid arrays are generally higher grade packages that have lower profiles and higher pin counts than conventional chip packages that use a lead frame.

Die-level packaged microelectronic devices are typically made by (a) forming a plurality of dies on a semiconductor wafer, (b) cutting the wafer to singulate the dies, (c) attaching individual dies to an individual interposer substrate, (d) wire-bonding the bond-pads to the terminals of the interposer substrate, and (e) encapsulating the dies with a molding compound. Mounting individual dies to individual interposer substrates is time consuming and expensive. Also, as the demand for higher pin counts and smaller packages increases, it becomes more difficult to (a) form robust wire-bonds that can withstand the forces involved in molding processes and (b) accurately form other components of die-level packaged devices. Therefore, packaging processes have become a significant factor in producing semiconductor and other microelectronic devices.

Another process for packaging microelectronic devices is wafer-level packaging. In wafer-level packaging, a plurality of microelectronic dies are formed on a wafer and a redistribution layer is formed over the dies. The redistribution layer includes a dielectric layer, a plurality of ball-pad arrays on the dielectric layer, and a plurality of traces coupled to individual ball-pads of the ball-pad arrays. Each ball-pad array is arranged over a corresponding microelectronic die, and the traces couple the ball-pads in each array to corresponding bond-pads on the die. After forming the redistribution layer on the wafer, a stenciling machine deposits discrete blocks of solder paste onto the ball-pads of the redistribution layer. The solder paste is then reflowed to form solder balls or solder bumps on the ball-pads. After forming the solder balls on the ball-pads, the wafer is cut to singulate the dies. Microelectronic devices packaged at the wafer level can have high pin counts in a small area, but they are not as robust as devices packaged at the die level.

In the process of forming and packaging microelectronic devices, numerous holes are formed in the wafer and subsequently filled with material to form conductive lines, bond-pads, interconnects, and other features. One existing method for forming holes in wafers is reactive ion etching (RIE). In RIE, many holes on the wafer can be formed simultaneously. RIE, however, has several drawbacks. For example, RIE may attack features in the wafer that should not be etched, and the RIE process is slow. Typically, RIE processes have removal rates of from approximately 5 µ/min to approximately 50 µ/min. Moreover, RIE requires several additional process steps, such as masking and cleaning.

Another existing method for forming holes in wafers is laser ablation. A conventional laser ablation process includes forming a series of test holes in a test wafer to determine the time required to form various through holes in the test wafer. The test holes are formed by directing the laser beam to selected points on the wafer for different periods of time. The test wafer is subsequently inspected manually to determine the time required to form a through hole in the wafer. The actual time for use in a run of identical wafers is then calculated by adding an overdrill factor to the time required to drill the test holes to ensure that the holes extend through the wafer. A run of identical wafers is then processed based on the data from the test wafer. A typical laser can form more than 10,600 holes through a 750 Å wafer in less than two minutes.

Laser ablation, however, has several drawbacks. For example, the heat from the laser beam creates a heat-affected zone in the wafer in which doped elements can migrate. Moreover, because the wafer thickness is generally non-uniform, the laser may not form a through hole in thick regions of the wafer or the wafer may be overexposed to the laser beam and consequently have a large heat-affected zone in thin regions of the wafer. Accordingly, there exists a need to improve the process of forming through holes or deep blind holes in microfeature workpieces.

DETAILED DESCRIPTION

A. Overview

Figure 1:
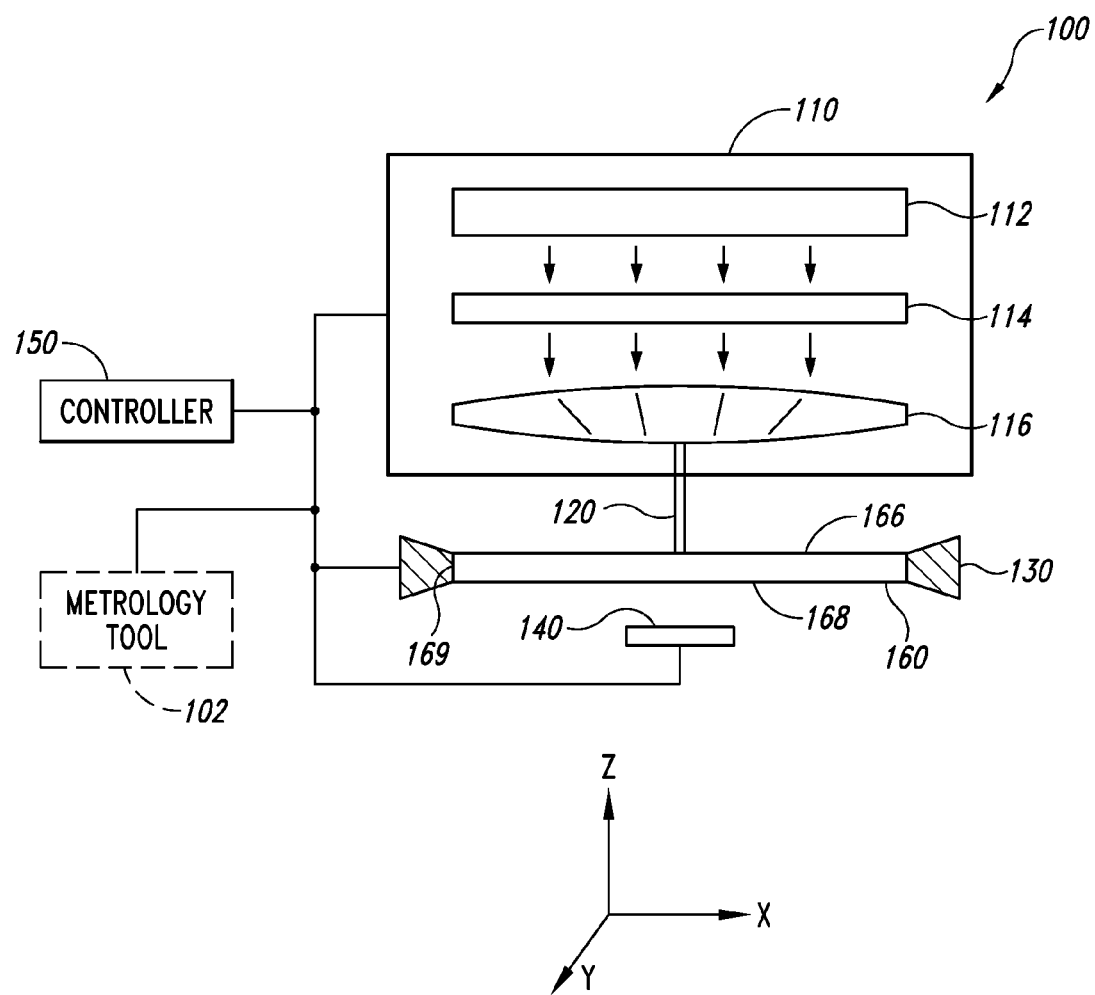
FIG. 1 is a schematic view of a system for forming an aperture in a microfeature workpiece in accordance with one embodiment of the invention.

The present invention is directed toward systems and methods for forming apertures in microfeature workpieces. The term "microfeature workpiece" is used throughout to include substrates in or on which microelectronic devices, micromechanical devices, data storage elements, and other features are fabricated. For example, microfeature workpieces can be semiconductor wafers, glass substrates, insulated substrates, or many other types of substrates. Several specific details of the invention are set forth in the following description and in FIGS. 1-4 to provide a thorough understanding of certain embodiments of the invention. One skilled in the art, however, will understand that the present invention may have additional embodiments, or that other embodiments of the invention may be practiced without several of the specific features explained in the following description.

Several aspects of the invention are directed to methods for forming apertures in microfeature workpieces. In one embodiment, a method includes directing a laser beam toward a microfeature workpiece to form an aperture and sensing the laser beam pass through the microfeature workpiece in real time. In one aspect of this embodiment, the method further includes determining a number of pulses of the laser beam and/or an elapsed time to form the aperture and controlling the laser beam based on the determined number of pulses and/or the determined elapsed time to form a second aperture in the microfeature workpiece. In another aspect of this embodiment, an electromagnetic radiation sensor senses the laser beam. The method can further include positioning the microfeature workpiece between a laser and an electromagnetic radiation sensor before directing the laser beam.

In another embodiment, a method includes ablating a microfeature workpiece by directing pulses of a laser beam to form a test aperture in the microfeature workpiece and automatically determining a number of pulses of the laser beam and/or an elapsed time to form the test aperture. The method further includes automatically controlling the laser beam based on the determined number of pulses and/or the determined elapsed time to form a plurality of production apertures in the microfeature workpiece. In one aspect of this embodiment, automatically controlling the laser beam includes directing the laser beam toward the microfeature workpiece for an adjusted number of pulses and/or an adjusted time to form at least one of the production apertures. The adjusted number of pulses can be different from the determined number of pulses, and the adjusted time can be different from the determined elapsed time. For example, if the production aperture is a blind hole, the adjusted number of pulses can be less than the determined number of pulses and/or the adjusted time can be less than the determined elapsed time by an underdrill factor. Alternatively, if the production aperture is a through hole, the adjusted number of pulses can be greater than the determined number of pulses and/or the adjusted time can be greater than the determined elapsed time by an overdrill factor.

Another aspect of the invention is directed to systems for forming apertures in microfeature workpieces. In one embodiment, a system includes a laser configured to produce a laser beam along a beam path, an electromagnetic radiation sensor positioned along the beam path to sense the laser beam, and a workpiece carrier configured to selectively position a microfeature workpiece in the beam path before the electromagnetic radiation sensor to form an aperture in the microfeature workpiece. The system can further include a controller operably coupled to the laser, the electromagnetic radiation sensor, and the workpiece carrier. The controller can have a computer-readable medium containing instructions to perform any one of the above-described methods.

B. Embodiments of Systems for Forming Apertures in Microfeature Workpieces

FIG. 1 is a schematic view of a system 100 for forming an aperture in a microfeature workpiece 160 in accordance with one embodiment of the invention. In the illustrated embodiment, the system 100 includes a laser 110, a workpiece carrier 130, a sensor 140, and a controller 150. The laser 110, the workpiece carrier 130, and the sensor 140 are operatively coupled to the controller 150. The laser 110 selectively generates a laser beam 120 to form apertures in the microfeature workpiece 160 by ablating the workpiece material. The system 100 can also include a metrology tool 102 (shown schematically in broken lines) to determine the thickness of portions of the microfeature workpiece 160.

The laser 110 can include an illumination source 112, a galvo mirror 114, and a telecentric lens 116. In one embodiment, the laser 110 can be a solid-state laser that produces a laser beam with a wavelength of approximately 355 nm and a pulse frequency of approximately 10 kHz to approximately 75 kHz. In one aspect of this embodiment, the power generated by the laser 110 can be approximately 7 watts, and the laser beam can have a pulse frequency of approximately 20 kHz to approximately 30 kHz. In additional embodiments, other lasers may be used with different configurations.

The workpiece carrier 130 is configured to hold and properly position the microfeature workpiece 160. More specifically, the workpiece carrier 130 positions the microfeature workpiece 160 relative to the laser 110 so that the laser beam 120 forms an aperture at a desired location on the workpiece 160. The workpiece carrier 130 can be moveable along three orthogonal axes, such as a first lateral axis (X direction), a second lateral axis (Y direction), and/or an elevation axis (Z direction). In other embodiments, the workpiece carrier 130 may not be movable along all three orthogonal axes, and/or the laser 110 may be movable.

In the illustrated embodiment, the workpiece carrier 130 engages and supports the perimeter of the microfeature workpiece 160. More specifically, the microfeature workpiece 160 has a first surface 166, a second surface 168 opposite the first surface 166, and a perimeter edge 169. The workpiece carrier 130 can have an edge-grip end effector configured to engage the perimeter edge 169 of the microfeature workpiece 160 without contacting the first and second surfaces 166 and 168. In other embodiments, the workpiece carrier 130 may contact a portion of the first and/or second surfaces 166 and/or 168 of the microfeature workpiece 160. For example, the workpiece carrier 130 may engage the perimeter edge 169 and a perimeter region of the second surface 168 to carry the microfeature workpiece 160 without obscuring the laser beam 120 from passing through the desired points on the workpiece 160.

The sensor 140 senses electromagnetic radiation to determine when the aperture has been formed in the microfeature workpiece 160. More specifically, the sensor 140 detects when the laser beam 120 passes through the microfeature workpiece 160 and sends a signal to the controller 150 indicating that an aperture has been formed. The sensor 140 can be an electromagnetic radiation sensor, such as a photodiode, selected to respond to the wavelength of the laser beam 120. The laser 110 and the sensor 140 can be arranged so that the workpiece carrier 130 can position the microfeature workpiece 160 between the laser 110 and the sensor 140. The sensor 140 can be movable relative to the microfeature workpiece 160 to be aligned with the laser beam 120. For example, the sensor 140 can be moveable along the three orthogonal axes X, Y and Z. In other embodiments, the sensor 140 can be fixed relative to the laser 110 such that they can move together.

Figure 2:
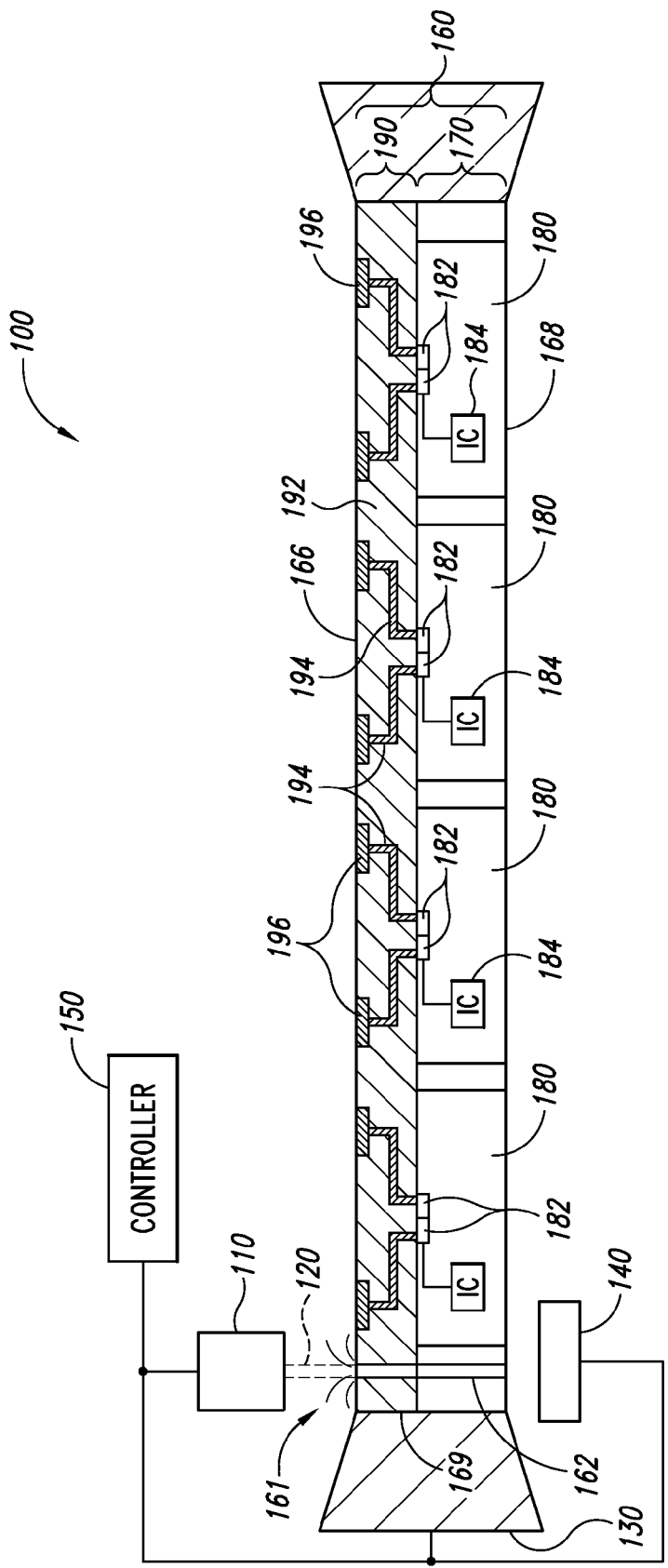
FIG. 2 is a schematic side cross-sectional view of the system of FIG. 1 with the laser directing a laser beam toward the microfeature workpiece.

FIG. 2 is a schematic side cross-sectional view of the system 100 with the laser beam 120 directed toward the microfeature workpiece 160 (shown enlarged for illustrative purposes). In the illustrated embodiment, the microfeature workpiece 160 includes a substrate 170 having a plurality of microelectronic dies 180 and a redistribution layer 190 formed on the substrate 170. Each microelectronic die 180 can have an integrated circuit 184 (shown schematically) and a plurality of bond-pads 182 coupled to the integrated circuit 184. The redistribution layer 190 includes a dielectric layer 192 and a plurality of ball-pads 196 in the dielectric layer 192. The ball-pads 196 are arranged in ball-pad arrays relative to the microelectronic dies 180 such that each die 180 has a corresponding array of ball-pads 196. The redistribution layer 190 also includes a plurality of conductive lines 194 in or on the dielectric layer 192 to couple the bond-pads 182 of the microelectronic dies 180 to corresponding ball-pads 196 in the ball-pad arrays. In other embodiments, the microfeature workpiece 160 may not include microelectronic dies 180 and/or the redistribution layer 190. For example, the microfeature workpiece 160 can be a circuit board or other substrate.

C. Embodiments of Methods for Forming Apertures in Microfeature Workpieces

FIG. 2 also illustrates an embodiment of a method for forming apertures in microfeature workpieces. The controller 150 generally contains computer operable instructions that generate signals for controlling the laser 110, the workpiece carrier 130, and the sensor 140 to form a single aperture or a plurality of apertures in the microfeature workpiece 160. In one embodiment, the controller 150 controls the laser 110 to form a test aperture 162 in the microfeature workpiece 160 and determines the number of pulses of the laser beam 120 and/or the time required to form the test aperture 162. In this embodiment, the laser 110 directs the laser beam 120 toward the first surface 166 of the microfeature workpiece 160 at a test location to form the test aperture 162. The laser beam 120 locally ablates the workpiece material and produces a vapor 161 that can be convected away from the region adjacent to the test aperture 162. The laser 110 directs the laser beam 120 toward the microfeature workpiece 160 until the sensor 140 senses the laser beam 120. The sensor 140 detects the laser beam 120 when the test aperture 162 extends through the microfeature workpiece 160. When the sensor 140 detects the laser beam 120, it sends a signal to the controller 150 which in turn sends a control signal to the laser 110 to stop generating the laser beam 120. The controller 150 stores the elapsed time and/or the number of pulses of the laser beam 120 required to form the test aperture 162.

Figure 3:
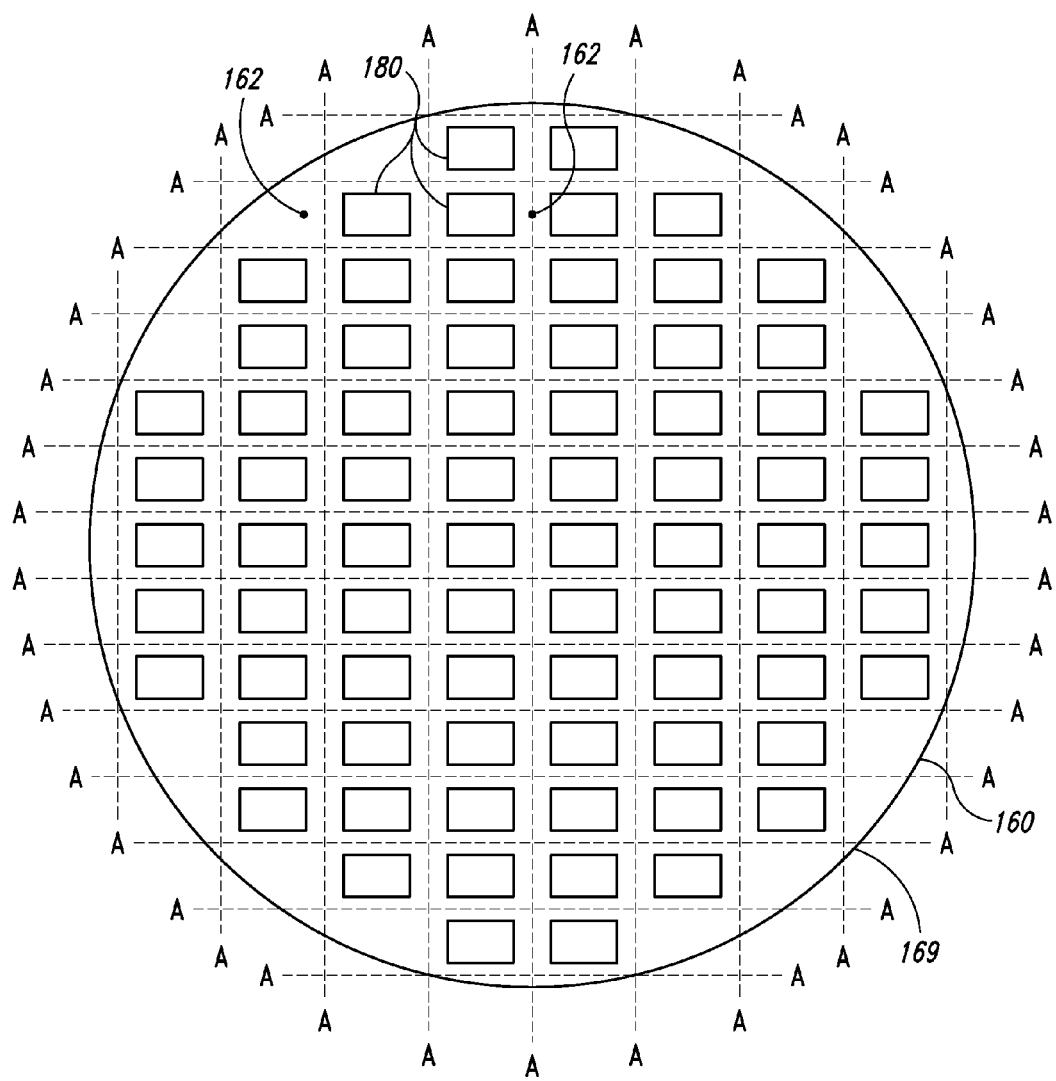
FIG. 3 is a top plan view of the microfeature workpiece without a redistribution layer.

The test aperture 162 can be formed in a noncritical portion of the microfeature workpiece 160. For example, FIG. 3 is a top plan view of the microfeature workpiece 160 without the redistribution layer 190. Referring to FIGS. 2 and 3, test apertures 162 can be formed in a perimeter region of the microfeature workpiece 160 proximate to the perimeter edge 169 and/or along the singulation lines A-A (FIG. 3) where the workpiece 160 is cut to separate the packaged microelectronic dies 180. Accordingly, in the illustrated embodiment, the portion of the microfeature workpiece 160 that includes the test aperture(s) 162 is not used for circuitry or other components of the dies 180 or workpiece 160. A plurality of test apertures are generally formed in a microfeature workpiece, but in many applications only a single test aperture may be formed in a workpiece. In other embodiments, not every workpiece in a run of workpieces needs to include a test aperture.

Figure 4:
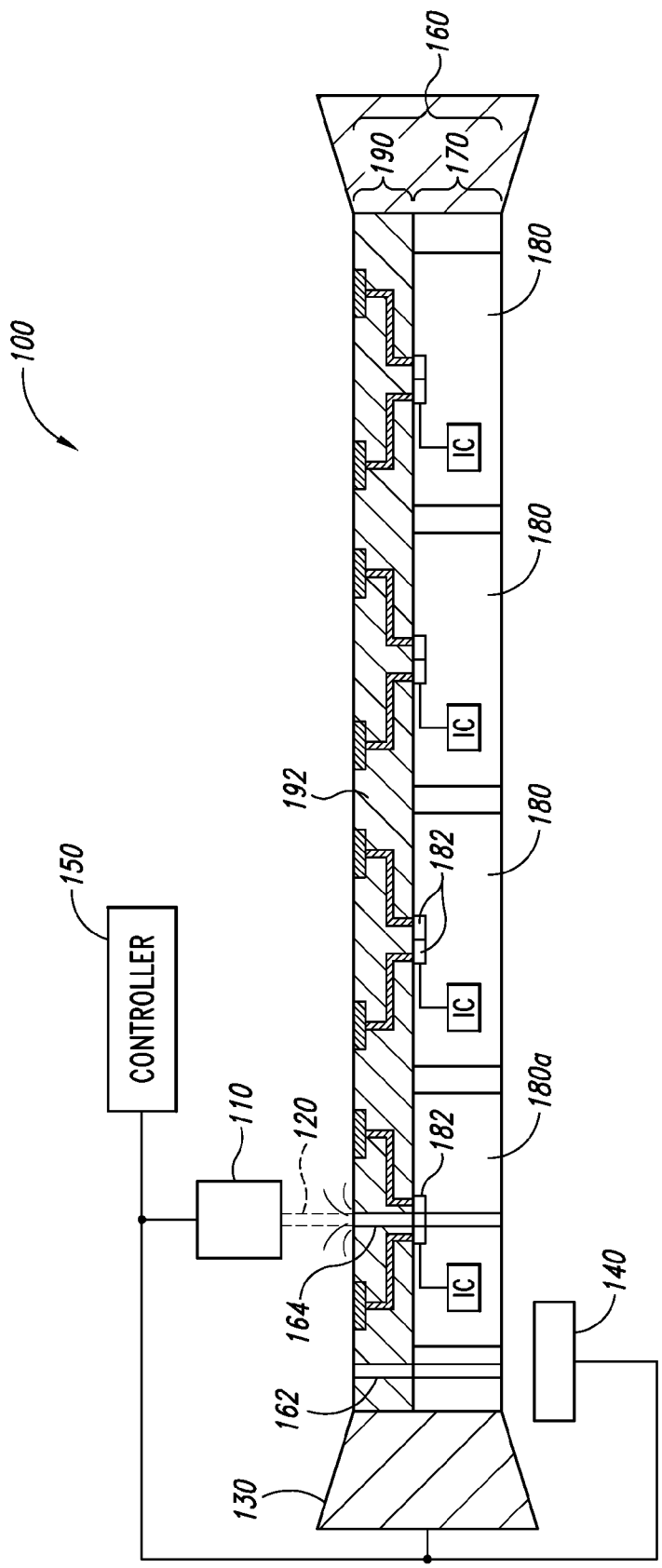
FIG. 4 is a schematic side cross-sectional view of the system of FIG. 1 with the laser forming a production aperture in the microfeature workpiece.

FIG. 4 is a schematic side cross-sectional view of the system 100 with the laser 110 forming a production aperture 164 in the microfeature workpiece 160. Based on the data gathered from forming the test aperture 162, the controller 150 and/or an operator develops a recipe to form the production aperture 164. The controller 150 can use the number of pulses of the laser beam 120 and/or the elapsed time to form the test aperture 162 in forming the production aperture 164. For example, the controller 150 can calculate an expected number of pulses of the laser beam 120 required to form the production aperture 164 based on the stored number of pulses required to form the test aperture 162. Additionally, the controller 150 can calculate an expected time required to form the production aperture 164 based on the stored elapsed time to form the test aperture 162.

In one embodiment, the expected number of pulses of the laser beam 120 and the expected time required to form the production aperture 164 are determined by multiplying the stored number of pulses and the stored elapsed time to form the test aperture 162 by a correction factor. The correction factor can adjust for differences in the thickness across the microfeature workpiece 160. For example, the metrology tool 102 (FIG. 1) can measure the thickness of the workpiece 160 at the test aperture 162 location and at the production aperture 164 location. The correction factor can account for the difference in the thickness of the workpiece 160 at the two locations. The correction factor can also adjust for differences in the workpiece material at the test aperture 162 location and at the production aperture 164 location. For example, in the illustrated embodiment, the test aperture 162 is formed through material adjacent to a first die 180a, and the production aperture 164 is formed through the first die 180a including the bond-pads 182. The correction factor can also increase the reliability of the process. For example, if the production aperture is a through hole, the correction factor can include an overdrill factor to increase the likelihood that the production aperture is formed completely through the microfeature workpiece.

After the controller 150 calculates the expected number of pulses of the laser beam 120 and/or the expected time required to form the production aperture 164, the system 100 forms the production aperture 164 in the microfeature workpiece 160. The workpiece carrier 130 properly positions the microfeature workpiece 160 relative to the laser 110, and then the laser 110 directs the laser beam 120 toward the workpiece 160 for the expected number of pulses of the laser beam 120 and/or for the expected time required to form the production aperture 164. In this embodiment, the sensor 140 does not need to be aligned with the production aperture 164 because the controller 150 controls the laser 110 based on the data gathered from forming the test aperture 162. However, in other embodiments, the system 100 may form the production aperture 164 without first forming the test aperture 162. In these embodiments, the sensor 140 can be aligned with the production aperture 164 to signal the controller 150 when the production aperture 164 has been formed, as described above with reference to FIG. 2. In any of these embodiments, the system 100 can form a plurality of production apertures in the microfeature workpiece 160.

In additional embodiments, the system 100 can also form blind apertures that do not extend completely through the microfeature workpiece 160. In these embodiments, the controller 150 can calculate the expected number of pulses and/or the expected time required to form the blind production aperture based on the data gathered from forming the test aperture 162 in a process similar to that described above. More specifically, the expected number of pulses of the laser beam 120 and the expected time required to form the blind production aperture can be determined by multiplying the stored number of pulses and the stored elapsed time to form the test aperture 162, respectively, by a correction factor. The correction factor in this application can adjust for differences in the workpiece material and thickness as described above to underdrill the workpiece for forming a blind production aperture. The correction factor also adjusts for the difference between the depth of the test aperture 162 and the desired depth of the blind production aperture. In other embodiments, the correction factor can also adjust for other factors.

One feature of the system 100 of the illustrated embodiment is that it provides good control of the exposure time that the microfeature workpiece 160 is subject to the laser beam 120. The laser beam 120 can be shut off after an aperture is formed because either the sensor 140 provides real-time feedback to the controller 150 or the controller 150 is able to accurately predict when the aperture has been formed. An advantage of this feature is that the heat-affected zone in the microfeature workpiece 160 is mitigated because the laser beam 120 is shut off in a timely manner. In prior art systems, the laser beam continues to pulse even after an aperture is formed and consequently increases the size of the heat-affected zone in the workpiece; such sizable heat-affected zones are detrimental to microelectronic devices because doped elements can migrate within the zone. Another advantage of the illustrated system 100 is that it enables high throughput using lasers and prolongs the life of the laser 110 because the number of pulses of the laser beam 120 required to form the apertures is reduced.

Another feature of the system 100 of the illustrated embodiment is that the system 100 consistently forms accurate apertures in the microfeature workpiece 160. An advantage of this feature is that apertures are consistently formed with a desired depth. The ability of the system 100 to more precisely determine the number of pulses of the laser beam 120 and/or the elapsed time to form a through hole allows the system 100 to avoid overdrilling and underdrilling.

From the foregoing, it will be appreciated that specific embodiments of the invention have been described herein for purposes of illustration but that various modifications may be made without deviating from the spirit and scope of the invention. Accordingly, the invention is not limited except as by the appended claims.

We claim:

1. A method for forming a plurality of apertures in a microfeature workpiece, the method comprising:
    impinging a laser beam upon the microfeature workpiece to form a first aperture;
    sensing the laser beam pass through the microfeature workpiece with a sensor; and
    forming a second aperture by controlling the laser beam based on a determined number of pulses of the laser beam to form the first aperture and/or a determined elapsed time to form the first aperture.

2. The method of claim 1 wherein forming the second aperture comprises automatically determining the number of pulses of the laser beam and/or the elapsed time to form the first aperture.

3. The method of claim 1 wherein forming the second aperture comprises:
    selecting an adjusted number of pulses by changing the determined number of pulses according to a correction factor; and
    directing the laser beam toward the microfeature workpiece for the adjusted number of pulses to form the second aperture.

4. The method of claim 1 wherein forming the second aperture comprises:
    selecting an adjusted time by changing the determined elapsed time according to a correction factor; and
    directing the laser beam toward the microfeature workpiece for the adjusted time to form the second aperture.

5. The method of claim 1 wherein:
    the second aperture comprises a blind hole; and
    forming the second aperture comprises controlling the laser beam based on a selected depth of the blind hole.

6. The method of claim 1 wherein:
    the microfeature workpiece includes a first surface and a second surface opposite the first surface; and
    the method further comprises supporting the microfeature workpiece with a workpiece carrier so that a center region of the first surface and a center region of the second surface do not contact the workpiece carrier while directing the laser beam.

\* \* \* \* \*

UNITED STATES PATENT AND TRADEMARK OFFICE
CERTIFICATE OF CORRECTION

| | | |
|---|---|---|
| PATENT NO. | : 8,686,313 B2 | |
| APPLICATION NO. | : 14/029105 | |
| DATED | : April 1, 2014 | |
| INVENTOR(S) | : Charles M. Watkins et al. | |

It is certified that error appears in the above-identified patent and that said Letters Patent is hereby corrected as shown below:

On the Title page, in item (62), under "Related U.S. Application Data", in column 1, line 2, delete "Pat. No. 8,534,485," and insert -- Pat. No. 8,536,485, --, therefor.

In the Specification

In column 1, line 9, delete "Pat. No. 8,534,485," and insert -- Pat. No. 8,536,485, --, therefor.

Signed and Sealed this
Thirtieth Day of September, 2014

Michelle K. Lee
*Deputy Director of the United States Patent and Trademark Office*